United States Patent [19]

Anthony et al.

[11] 3,901,736

[45] Aug. 26, 1975

[54] METHOD OF MAKING DEEP DIODE DEVICES

[75] Inventors: Thomas R. Anthony; Harvey E. Cline, both of Schenectady, N.Y.

[73] Assignee: General Electric Company, Schenectady, N.Y.

[22] Filed: Oct. 30, 1973

[21] Appl. No.: 411,150

[52] U.S. Cl. .................. 148/1.5; 148/171; 148/172; 148/173; 148/177; 148/179; 148/186; 148/187; 148/188; 252/62.3 E; 252/62.3 GA; 148/33

[51] Int. Cl. .............................................. H01l 7/42

[58] Field of Search ............ 148/177, 179, 171–173, 148/186–188, 1.5; 252/62.3 E, 62.3 GA

[56] References Cited

UNITED STATES PATENTS

| | | | |
|---|---|---|---|
| 2,813,048 | 11/1957 | Pfann | 148/1 |
| 2,858,246 | 10/1958 | Pearson | 148/179 X |
| 3,205,101 | 9/1965 | Mlavsky et al. | 148/1.5 X |
| 3,360,851 | 1/1968 | Kahng et al. | 148/188 X |
| 3,575,823 | 4/1971 | Gordon | 204/15 |
| 3,671,339 | 6/1972 | Tateno et al. | 148/179 |

*Primary Examiner*—G. Ozaki

*Attorney, Agent, or Firm*—Charles T. Watts; Joseph J. Cohen; Jerome C. Squillaro

[57] ABSTRACT

Parallel spaced P-N junctions extending as columns or planes through a silicon wafer are made by covering the wafer surface so that portions are exposed in desired pattern, then removing portions of the surface of the wafer so exposed to produce recesses in the wafer, thereafter filling the recesses with aluminum and removing the covering, then heating and forming a liquid body in each recess. By maintaining a finite thermal gradient in a first direction through the wafer and maintaining a zero thermal gradient through the wafer in a direction normal to that first direction, the several liquid bodies are caused to migrate through the silicon wafer along separate straight lines to reproduce the recess pattern as recrystallized regions within the wafer.

9 Claims, 18 Drawing Figures

METHOD OF MAKING DEEP DIODE DEVICES

The present invention relates generally to the art of temperature gradient zone melting, and is concerned more particularly with a novel method of producing deep diodes by providing initially a liquid solution source in solid form in recesses within the surface of a semiconductor body.

CROSS REFERENCES

This invention is related to those disclosed and claimed in the following patent applications assigned to the assignee hereof and filed of even date herewith:

Patent Application Ser. No. 411,001, filed Oct. 30, 1973, entitled "Deep Diode Devices and Method and Apparatus" in the names of Thomas R. Anthony and Harvey E. Cline, which discloses and claims the concept of carrying out thermal gradient zone melting under conditions such that heat flow through the workpiece is unidirectional.

Patent Application Ser. No. 411,015, filed Oct. 30, 1973, entitled "High Velocity Thermomigration Method of Making Deep Diodes" in the names of Harvey E. Cline and Thomas R. Anthony, which discloses and claims the concept of carrying out thermal gradient zone melting at relatively high temperatures including temperatures approaching the melting point temperature of the material of the matrix body.

Patent Application Ser. No. 411,021, filed Oct. 30, 1973, entitled "Deep Diode Device Production Method" in the names of Harvey E. Cline and Thomas R. Anthony, which discloses and claims the concept of using the high velocity thermomigration method to produce migration trails of recrystallized material running lengthwise of an elongated matrix body and then dividing the matrix into a number of similar deep diodes by cutting the matrix body transversely at locations along the length of the migration trails.

Patent Application Ser. No. 411,009, filed Oct. 30, 1973, entitled "Deep Diode Device" in the names of Thomas R. Anthony and Harvey E. Cline, which discloses and claims the concept of minimizing the random walk of a migrating droplet in a thermal gradient zone melting operation by maintaining a thermal gradient a few degrees off the [100] axial direction of the crystal matrix body and thereby overwhelming the detrimental dislocation intersection effect.

Patent Application Ser. No. 411,008, filed Oct. 30, 1973, entitled "Stabilized Droplet Method of Making Deep Diodes Having Uniform Electrical Properties" in the names of Harvey E. Cline and Thomas R. Anthony, which discloses and claims the concept of controlling the cross-sectional size of a migrating droplet on the basis of the discovery that one mllimeter is the critical thickness dimension for droplet physical stability.

BACKGROUND OF THE INVENTION

The desirability of so-called "deep diodes" has long been recognized in the semiconductor art. Thus, certain inherent special properties and consequent advantages of deep diode devices over planar diodes are set forth in U.S. Pat. No. 2,813,048, issued Nov. 12, 1957 to W. G. Pfann. However, efforts by others heretofore to produce deep diode arrays have not been successful enough for general use. There are a number of important reasons for this failure of the prior art and those reasons are represented by the problems overcome by the invention described and claimed herein and the inventions of our copending cases referenced above. Consequently, all these inventions taken together constitute a comprehensive procedure incorporating a number of unique separate method steps leading collectively to a previously unachieved goal. Moreover, these several separate inventions can be employed individually and separately to produce certain additional desirable new results.

The particular problem in this instance concerned the initial stage of droplet migration when the liquid solution of metal and matrix material was to be formed to begin the penetration of the matrix by the droplet. Frequently, in an array of droplets a number of them would fail to penetrate and migrate through the matrix. Also, it was not possible to insure retention of the initial array pattern because of the tendency for droplets to shift out of position before penetrating the matrix. This situation was aggravated in the case of wire-like droplet migrations as in the production of grids where the pattern was lost through erratic migration effects.

Special measures taken in efforts to control the situation were not successful. Thus, it was found that the desired uniformity of droplet migration could not be obtained by providing as the droplet source a wire made as perfectly as possible as to straightness and diameter. Neither did it help to scribe a recess in the matrix surface in which to position the wire for the melting and migrating operations. Some success was realized, however, by providing relatively large diameter droplets but the devices which might be made in that manner are of only limited practical utility.

SUMMARY OF THE INVENTION

In making the present invention, we discovered that the marked tendency for deep diodes prepared in accordance with prior art teachings to be non-uniform in cross section and irregular in spacing can be eliminated.

In particular, we have found that by embedding or depositing the solid source of the migrating species within the matrix body, instead of on that body, the desired regularity and uniformity of the resulting P-N junctions can be consistently obtained without using large diameter droplets and without using wires as the source of droplets. Thus, this invention opens the way for the first time to the miniaturization of deep diode patterns, including intricate grids.

We have also discovered that the new results and advantages of this invention can be consistently obtained only when a deposit of embedded migrating species substantially fills the recess provided for it within the matrix at the outset of the process. In this context, a recess is substantially filled when on melting a deposit is restrained by the walls of the recess from assuming a spherical form. In that situation, contact between the migrating metal species and the matrix, in the absence of blocking oxide layer, migration is initiated quickly in the desired direction upon the establishment of the thermal gradient through the matrix body.

According to the best practice of the present invention, a suitable photolithography technique is employed to provide a predetermined pattern of P-N junction sites on the surface of a wafer of semiconducting material. Then, using a suitable etchant, the exposed surface portions of the wafer are removed to a depth such that the amount of liquid source material to be used to produce the P-N junctions will substantially fill the resulting recesses. This filling operation can be accomplished in any desired manner, but preferably it is done prior to the removal of the photoresist mask, particularly if vapor deposition or similar method is to be used with the result that the entire surface area in the region of the open recesses is coated.

As the next step, the mask and overlay deposit of material can be removed from the surface of the body so that the body is prepared for the heating step to follow. Alternatively, the photoresist mask and material covering it may be left intact when the wafer or workpiece is placed in the heating chamber for the thermomigration operation, stripping occurring promptly as the temperature of the wafer is rapidly raised.

DESCRIPTION OF THE DRAWINGS

Two different preferred embodiments of this invention are illustrated in the drawings accompanying and forming a part of this specification, in which.

DETAILED DESCRIPTION OF THE INVENTION

Figures 1, 2, 2A, 2B, 2C, 2D, 2E, 2F, 2G, 2H, 3, 3A, 3B, 3C, 3D, 3E, 3F, 3G:
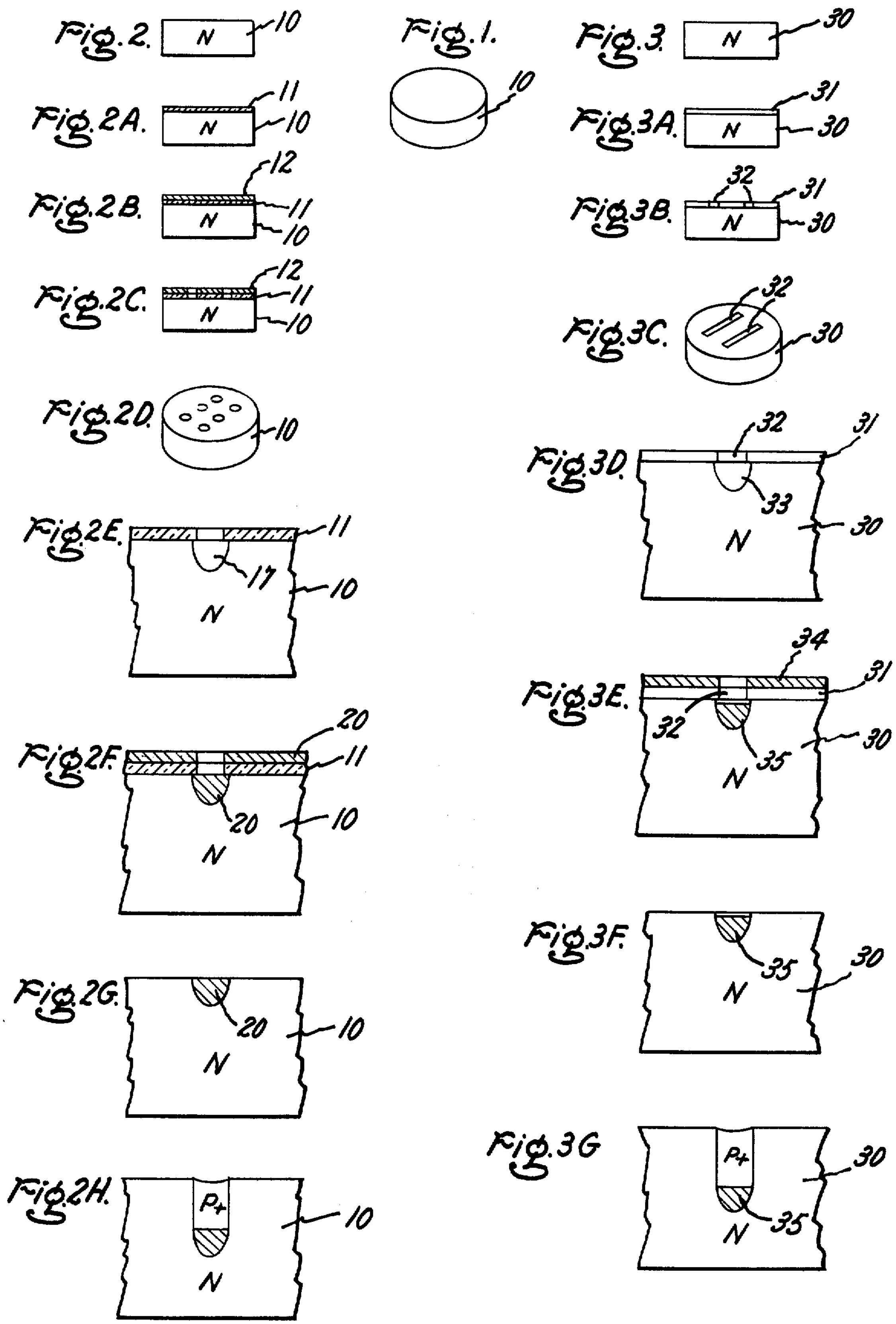
FIG. 1 is a view in perspective of a typical silicon wafer useful in the method of this invention.
FIGS. 2 – 2H illustrate the several separate steps of the process of this invention in all of its forms; and, FIGS. 3 – 3G illustrate another series of steps comprising an alternative form of the process of this invention.

In the embodiment of the invention illustrated in the series of FIGS. 2 – 2H, wafer 10 of silicon of one type of conductivity (N in this case) is cleaned to provide a fresh top surface and then subjected to oxidizing conditions resulting in formation of a silicon oxide layer 11. As the next step, a suitable photoresist 12 and mask (not shown) are provided on layer 11 and then "exposed" and "developed" suitably by conventional photolithography techniques to yield the pattern of apertures illustrated in FIGS. 2C and 2D. Then, in an etching step, oxide layer 11 is used as a mask. Recesses 17 of 20-micron depth are formed in the top surface of wafer 10. Photoresist 12 is removed prior to this etching step by heating in $H_2SO_4$ at 180°C, leaving coating 11 intact on the top surface of wafer 10.

With the etching step concluded, the workpiece 10 is ready for the application of the second fusible material, suitably aluminum, to fill recesses 17 in preparation for the thermomigration operation. This step is illustrated by FIG. 2F where, in accordance with suitable conventional vapor deposition procedure, a 20-micron-thick aluminum layer 20 is deposited on oxide layer 11 and in recesses 20. Layer 11 and overlaying aluminum layer 20 are removed from wafer 10, suitably by grinding, leaving the silicon wafer as shown in FIG. 2G.

Using thermomigrating apparatus (not shown) disclosed and claimed in copending application Ser. No. 411,001, filed Oct. 30, 1973, wafer 10 is heated to melt deposit 20 in each of the recesses 17. The resulting liquid solution bodies are then traveled into wafer 10, leaving trails of recrystallized material of P-type conductivity and providing P-N junctions at the interfaces between the trails and the wafer body. This thermomigration operation, illustrated in FIG. 2H, may be discontinued at the stage indicated or carried on until the liquid solution bodies have been migrated entirely through the wafer.

Referring to FIGS. 3 – 3G, in an operation similar to that of FIG. 2 involving the use of this invention in an alternative preferred way, a silicon wafer 30 similar to wafer 10 is provided with a photoresist 31 on its upper surface, as shown in FIG. 3A. The photoresist is then masked, exposed and then developed, as described in reference to FIGS. 2B and 2C to provide elongated openings 32 illustrated in FIG. 3B. Surface portions of wafer 30 exposed through openings 32 are contacted with an etchant to provide 20-micron-deep recesses 33 in the form of parallel grooves extending across the top of wafer 30. The fusible material, preferably aluminum, to be thermomigrated through wafer 30 is then deposited to a depth of nearly 20 microns on the exposed upper portion of assembly (at 34), with the result shown in FIG. 3E, each recess 33 being almost filled with an aluminum mass 35. Next, the assembly is placed upside down (not shown) in a thermomigrating oven where the photoresist layer 31 is quickly burned away with the resulting removal of overlayer 34. Alternatively, the photoresist layer 31 and overlaying aluminum layer 34 can be removed selectively by chemical means such as heating in $H_2SO_4$ at 180°C. As the temperature is maintained in the thermomigrating apparatus and aluminum masses 35 are melted to produce liquid solution bodies in recesses 33, the migration begins and progresses after the manner described in the reference to FIG. 2H and also illustrated in FIG. 3G. Thus, again a P-type recrystallized region is produced in the wake of each of the migrating aluminum-liquid solution bodies and two separate sets of P-N junctions extending into or through wafer 30 are formed at the interfaces between the N-type wafer 30 and the P-type migration trails.

The wafer or workpiece semiconductor material body used in this invention process may be other than silicon, such as silicon carbide, germanium, gallium arsenide, a compound of a Group II element and a Group VI element, or a compound of a Group III element and a Group V element. Likewise, the material of the migrating species can be other than pure or suitably-doped aluminum, which is fusible and capable of forming a liquid solution with the material of the matrix body or wafer to provide a recrystallized region of selected conductivity and resistivity different from that of the wafer as it is migrated therethrough. If the conductivity is opposite to that of the matrix material, a P-N junction would be created at the interface of the two different materials. Also, the wafer or matrix body material and the migrating species should be selected so as to insure that the melting point temperature of the former is above, and preferably substantially above, the melting point temperature of the liquid solution of the migrating species material and the wafer or matrix body material.

The following illustrative, but not limiting, examples of the actual practice of this invention will further inform those skilled in the art concerning details of the best mode contemplated of carrying out this new process of ours:

EXAMPLE I

An N-type, 10 ohm-cm silicon single crystal of 1-inch diameter of (111) axial orientation was sliced into wafers one inch thick. The wafers were mechanically polished and chemically etched to remove any damaged surface and then rinsed in deionized water and dried in air. A 1 micron silicon oxide layer was grown thermally on the wafer surface and a metal etch photoresist layer was applied to the silicon oxide layer surface and baked dry at about 80°C. A mask in the pattern of FIG. 2D was disposed over the photoresist before exposure to a U-V light source. Development consisted of washing with xylene and the portions of the silicon oxide layer thus exposed were selectively etched and removed through use of a buffered hydrofluoric acid solution ($NH_4F/HF$). The surface portions of the silicon wafer thereby exposed were treated with a mixed acid solution following a deionized water rinse. The acid solution consisted of 10 HF, 40 acetic acid, 100 $HNO_3$ (parts by volume) and it was effective to selectively etch the silicon at the rate of about five microns of depth per minute. After five minutes, the etched wafer was again water-rinsed and then blown dry with argon.

A layer of aluminum was vapor-deposited on the wafer in a conventional metal evaporation vacuum chamber, providing a high-purity filling in the freshly-formed recesses in the wafer surface. To insure that the aluminum was free of $O_2$ which could prevent good wetting and penetration of the droplets into the silicon surface recesses, the vapor deposition of of aluminum was performed at $1 \times 10^{-5}$ torr. After removal of the excess aluminum overlaying the silicon oxide masking layer by mechanical grinding to leave only the aluminum-filled recesses in the silicon crystal, thermomigration was accomplished by subjecting the sample to a temperature gradient of 50°C/cm along the (111) axis of the sample at a mean sample temperature of 1100°C for 24 hours. The apparatus disclosed and claimed in our copending case, Ser. No. 411,001 was used to carry out this thermomigration operation.

On examination of the resulting silicon wafer product, it was noted that the aluminum deposits had been migrated from the recessed surface to the opposite surface, leaving straightline trails of recrystallized material of P-type semiconductivity. The original recess pattern was exactly reproduced on the opposite side of the wafer where the migrating droplets emerged from within the wafer bulk.

As the aluminum-silicon liquid solution droplets traveled through the silicon wafer along the [111] axis of the crystal, they assumed the form of triangular platelets lying in the (111) plane, being bounded on their edges by (112) planes.

EXAMPLE II

In another experiment like that of Example I, antimony-doped gold was employed instead of aluminum. Deposition of the metal in the recesses in the silicon wafer surface was accomplished through a evaporation operation, a gold-antimony source consisting of 90 per cent gold and 10 per cent antimony being subjected to evaporation conditions in the usual manner in a vacuum chamber.

Following the procedure of Example I, the gold-antimony deposits were melted and migrated through the silicon crystal. The result was a product like that of Example I in regard to the straight-line migration trails and faithful reproduction of the recess pattern on the opposite surface of the wafer. Also, the trails were recrystallized regions of N-type material having, however, greater conductivity and lesser resistivity than the silicon crystal wafer material. Consequently, unlike the Example I product, this one does not have P-N junctions but rather has two different kinds of N-type regions. These trail regions can therefore serve as collectors or leads for semiconductor devices, i.e., P-N junctions associated with them.

EXAMPLE III

In an experiment designed to illustrate the excellent electrical characteristics of devices made by this invention, a varistor was produced using the procedure described in Example I and the method and apparatus disclosed and claimed in our copending patent application Ser. No. 411,001, filed Oct. 30, 1973. Thus, a body of N-type silicon 1 centimeter thick and of one inch diameter having 10 ohm-centimeter resistivity and a carrier concentration of $5 \times 10^{14}$ atoms per cubic centimeter was subjected to the thermal gradient zone melting process of migrating aluminum droplets, that is, "wires", through the silicon body. The method disclosed and claimed in our copending patent application Ser. No. 411,015 was employed to accelerate the droplet migration with the result that the droplets traveled all the way through the wafer in 12 hours, the thermal gradient being maintained at 50°C/cm and the hot side temperature of the wafer being fixed at 1200°C throughout the migration period. Each of the wire droplet trails was P-type conductivity recrystallized semiconductor material of the body and had a carrier concentration of $2 \times 10^{19}$ atoms per cubic centimeter and a resistivity of $8 \times 10^{-3}$ ohm-centimeter. The recrystallized regions were each 13 mils (330 microns) in thickness. A varistor measuring 0.6 centimeter in length, 1 centimeter in width and 0.2 centimeter in thickness was prepared from the above-processed body. The varistor had ten P-N junctions and its breakdown voltage was 4500 volts. The varistor showed electrical characteristics qualifying it for use in electric circuits to protect electrical equipment from overvoltages. The resistivity throughout the N- and P-type regions was substantially constant throughout the overall region and the processed body exhibited substantially theoretical physical values for the material used. Upon sectioning and examination, the varistor was found to have sharply defined P-N junctions, each with a concentration profile of about 0.3 micron width.

In the devices of this invention, the trails left by the migrating droplet are actually regions of recrystallized material extending part way or all the way through the semiconductor matrix body crystal. The conductivity and resistivity of the crystal and the recrystallized region in each instance will be different so that these trails or recrystallized regions will form with the matrix body crystal P-N junctions suitably of the step type if desired. Alternatively, they may serve instead as lead-throughs if P-N junction characteristic does not exist in the structure. Recrystallized regions thus may be suitably doped with the material comprising the migrating droplet, that is, in admixture with the droplet metal, so as to provide impurity concentration sufficient to obtain the desired conductivity. The metal retained in the recrystallized region in each instance is substantially the maximum allowed by the solid solubility in the semiconductive material. It is a semiconductor material with maximum solid solubility of the impurity therein. It is not semiconductor material which has liquid solubility of the material. Neither is it a semiconductor material which is or contains a eutectic material. Further, such recrystallized region has a constant uniform level of impurity concentration throughout the length of the region or trail and the thickness of the recrystallized region is substantially constant throughout its depth or length.

while in the foregoing examples it has been indicated that the aluminum source of migrating droplet material was deposited under a vacuum of $1 \times 10^{-5}$ torr, it is to be understood that other vacuum conditions may be employed, particularly higher vacuums, and that lesser vacuums down to $3 \times 10^{-5}$ torr may be used with satisfactory results. We have found, however, that particularly in the case of aluminum, difficulty may be encountered in initiating droplet migration due to interference of oxygen with wetting of silicon by the aluminum when pressures less than $3 \times 10^{-5}$ torr are used in this operation. Similarly, aluminum deposited by sputtering will by virtue of saturation be difficult to use in this process of ours so far as initiation of the droplet penetration action is concerned. It is our preference, accordingly, for an aluminum deposition procedure which prevents more than inconsequential amounts of oxygen from being trapped in the aluminum deposits.

As a general proposition in carrying out the process of this invention and particularly the stage of forming the recesses or pits in the surface of the matrix body crystal to receive deposits of solid droplet source material, the depth of the recesses should not be greater than about 25 to 30 microns. This is for the purpose of avoiding the undercutting of the masking layer which would be detrimental in that the width of the droplet to be migrated might be too great or, in the extreme case, that the contact between the droplet and the matrix body surface would be limited to the extent that initiation of migration would be difficult and uncertain. In the normal use of the present invention process, and etching operation providing these recesses will be carried on for approximately five minutes at a temperature of 25°C to provide a recess depth of about 25 microns with a window opening size of from 10 to 500 microns according to the size of the opening defined by the mask.

What we claim as new and desire to secure by Letters Patent of the United States is:

1. The method of making a semiconductor device comprising a matrix body of semiconductor material of selected conductivity and selected resistivity and a plurality of separate and spaced recrystallized regions of different selected conductivity and selected resistivity extending into the interior of the matrix body in ordered array, which comprises the steps of providing a covering over a firt substantially planar surface of the matrix body so that portions of the surface of said body are exposed in a predetermined pattern, removing portions of the said body so exposed to provide a plurality of separate and spaced recesses of depth less than about 30 microns in the said first surface in the desired ordered array, substantially filling each of the resulting recesses with a solid metallic material with which the matrix semiconductor material will form a solution of melting point temperature below that of the matrix semiconductor material, heating the matrix body and thereby forming in each of the recesses a liquid body of a solution of the matrix semiconductor material and the metallic material, establishing and maintaining a finite temperature gradient in a first direction through the matrix body with the said first substantially planar surface being at a temperature lower than that of a second surface, and migrating the liquid bodies into the interior of the matrix body.

2. The method of claim 1 in which the covering is removed from the matrix body prior to the heating step and the liquid bodies are migrated all the way through the matrix body to the second surface.

3. The method of claim 1 in which the metallic material is vapor-deposited in the matrix body recesses until the walls of the recesses restrain the deposited metallic material in each of them from assuming spherical form.

4. The method of claim 3 in which the matrix body is silicon and the metallic material is aluminum which is free from aluminum oxide and in which the aluminum is vapor-deposited under a vacuum of $1 \times 10^{-5}$ torr.

5. The method of claim 1 in which the matrix body is N-type silicon and the metallic material is aluminum which is vapor-deposited under a vacuum of at least $3 \times 10^{-5}$ torr.

6. The method of claim 1 in which the matrix body is of gallium arsenide.

7. The method of claim 1 in which the matrix body consists of a wafer sliced from a <111> axial orientation silicon single crystal, and in which the first surface of the matrix wafer is polished and then oxidized to provide the covering defining a square array of openings through which the polished surface is exposed.

8. The method of claim 1 in which the matrix body is a silicon carbide single crystal and in which the solid metallic material is chromium.

9. The method of claim 1 in which a zero temperature gradient in a direction normal to the first direction is established and maintained while the liquid bodies are migrated into the matrix body.

* * * * *